United States Patent
Chun

(10) Patent No.: US 10,388,735 B2
(45) Date of Patent: Aug. 20, 2019

(54) SEMICONDUCTOR DEVICE

(71) Applicants: HYUNDAI MOTOR COMPANY, Seoul (KR); KIA MOTORS CORPORATION, Seoul (KR)

(72) Inventor: Dae Hwan Chun, Gwangmyeong-si (KR)

(73) Assignees: Hyundai Motor Company, Seoul (KR); KIA Motors Corporation, Seoul (KR)

( * ) Notice: Subject to any disclaimer, the term of this patent is extended or adjusted under 35 U.S.C. 154(b) by 0 days.

(21) Appl. No.: 15/957,428

(22) Filed: Apr. 19, 2018

(65) Prior Publication Data
US 2019/0189747 A1 Jun. 20, 2019

(30) Foreign Application Priority Data
Dec. 14, 2017 (KR) .................... 10-2017-0172339

(51) Int. Cl.
| H01L 29/76 | (2006.01) |
| H01L 29/10 | (2006.01) |
| H01L 29/06 | (2006.01) |
| H01L 29/08 | (2006.01) |
| H01L 29/78 | (2006.01) |
| H01L 29/417 | (2006.01) |
| H01L 29/16 | (2006.01) |
| H01L 29/36 | (2006.01) |

(52) U.S. Cl.
CPC ...... H01L 29/1033 (2013.01); H01L 29/0692 (2013.01); H01L 29/0847 (2013.01); H01L 29/1608 (2013.01); H01L 29/36 (2013.01); H01L 29/41741 (2013.01); H01L 29/41775 (2013.01); H01L 29/7827 (2013.01)

(58) Field of Classification Search
CPC ............ H01L 29/0692; H01L 29/0847; H01L 29/1608; H01L 29/36
See application file for complete search history.

(56) References Cited

U.S. PATENT DOCUMENTS

2008/0191307 A1* 8/2008 Darwish ............. H01L 29/0649
257/493

* cited by examiner

*Primary Examiner* — Samuel A Gebremariam
(74) *Attorney, Agent, or Firm* — Brinks Gilson & Lione

(57) ABSTRACT

The present disclosure provides a semiconductor device including a substrate, an n– type layer, an n+ type region, a p type region, a p+ type region, a gate insulating layer, a gate electrode, a source electrode, and a drain electrode, wherein the n+ type region is disposed at a left side and a right side of the n– type layer in a plan view and configured to form in a striped pattern in a plan view, wherein the p+ type region is disposed at an outer surface of the n+ type region in a plan view and configured to form in a striped pattern in a plan view, wherein the p type region is disposed at an inner surface the n+ type region in a plan view and is separated by a predetermined interval along a longitudinal direction of the n+ type region in a plan view.

10 Claims, 4 Drawing Sheets

SEMICONDUCTOR DEVICE

CROSS-REFERENCE TO RELATED APPLICATION

The present application claims priority to and the benefit of Korean Patent Application No. 10-2017-0172339 filed on Dec. 14, 2017, which is incorporated herein by reference in its entirety.

FIELD

The present disclosure relates to a semiconductor device.

BACKGROUND

The statements in this section merely provide background information related to the present disclosure and may not constitute prior art.

A low resistance or a low saturation voltage may be desired in a power semiconductor device in order to reduce the power loss in a conduction state while flowing a very large current. In addition, a high breakdown voltage characteristics, which is a characteristic that may withstand a reverse-direction high voltage applied to both terminals of the power semiconductor device during an off-state or when the switch is turned off, may be desired.

A concentration and a thickness of an epitaxial layer or a drift region of a raw material to form the power semiconductor device may be determined depending on a rated voltage required by a power system. According to a poisson equation, the epitaxial layer or the drift region of the low concentration and the thick thickness may be desired as much as the high breakdown-voltage of the power semiconductor device is desired. However, it might also increase an on-resistance and reduce a forwarding-direction current density. Accordingly, when designing the power semiconductor device, it may be desirable to overcome the above trade-off as much as possible.

In a case of a MOSFET element that includes an inversion layer channel applied with a silicon carbide (SiC), a stage of a silicon oxide layer and a silicon carbide interface is not good and may affect a flow of electrons/current passing through the channel generated adjacent to the silicon oxide layer. As a result, a mobility of electrons may be very low.

SUMMARY

The present disclosure provides the semiconductor device including an inversion layer channel and an accumulation layer channel.

A semiconductor device in one form of the present disclosure includes a substrate, an n− type layer, an n+ type region, a p type region, a p+ type region, a gate insulating layer, a gate electrode, a source electrode, and a drain electrode, wherein the n+ type region is respectively disposed at a left side and a right side of the n− type layer in a plan view, the p+ type region is disposed at an outer surface of the n+ type region in a plan view, the p type region is disposed at an inner surface the n+ type region in a plan view, the n+ type region and the p+ type region are configured to form in a striped pattern in a plan view, and the p type region is separated by a predetermined interval along a longitudinal direction of the n+ type region in a plan view.

The n− type layer may be disposed between the p type regions.

The n− type layer may be disposed at a first surface of the substrate, the n+ type region, the p type region, and the p+ type region may be disposed at an upper part of the n− type layer, the gate insulating layer may be disposed on the n− type layer, the p type region, and the n+ type region, the gate electrode may be disposed on the gate insulating layer, the source electrode may be insulated from the gate electrode and is disposed on the p+ type region and the n+ type region, and the drain electrode may be disposed at a second surface of the substrate.

A channel may be formed in the p type region and the n− type layer, wherein the p type region and the n− type layer overlap the gate insulating layer and are disposed at the outer surface of the n+ type region in a plan view.

The channel may include a first channel and a second channel.

The first channel may be formed at the p type region that overlaps the gate insulating layer and that is disposed at the inner surface of the n+ type region in a plan view.

The second channel may be formed at the n− type layer that overlaps the gate insulating layer and that is disposed at the inner surface of the n+ type region in a plan view.

The p type region may be disposed in a zigzag shape from a center line of the gate insulating layer in a plan view.

The p type region may be disposed in a symmetric shape from the center line of the gate insulating layer in a plan view.

The n+ type region and the p+ type region may be disposed at the upper part of the p type region.

The n+ type region and the p+ type region may be disposed adjacent to each other and are in contact with each other.

As described above, in some forms of the present disclosure, when the semiconductor device includes the inversion layer channel and the accumulation layer channel, the mobility of the electron and the current may be improved. Accordingly, the on-resistance of the semiconductor device may be reduced.

In addition, since the width of the accumulation layer channel may be controlled by the ion injection, the complexity of process may be reduced.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
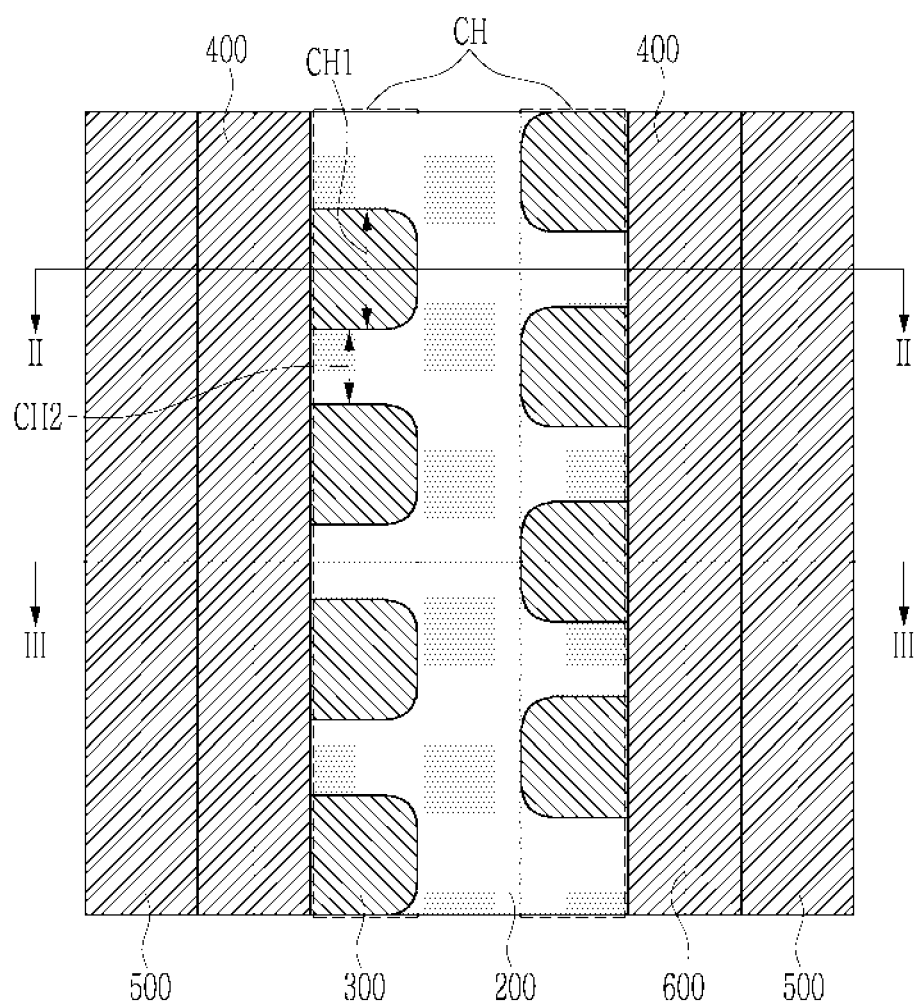
FIG. 1 is a view schematically showing an example of a layout of a semiconductor device.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Exemplary forms of the present disclosure will be described in detail with reference to the attached drawings. The present disclosure may be modified in many different forms and should not be construed as being limited to the exemplary forms set forth herein. Rather, the exemplary forms of the present disclosure are provided so that this disclosure will be thorough and complete, and will fully convey the concept of the present disclosure to those skilled in the art.

In the drawings, the thickness of layers and regions may be exaggerated for clarity. In addition, when a layer is described to be formed on another layer or on a substrate, this means that the layer may be formed on the other layer or on the substrate, or a third layer may be interposed between the layer and the other layer or the substrate.

Figure 2:
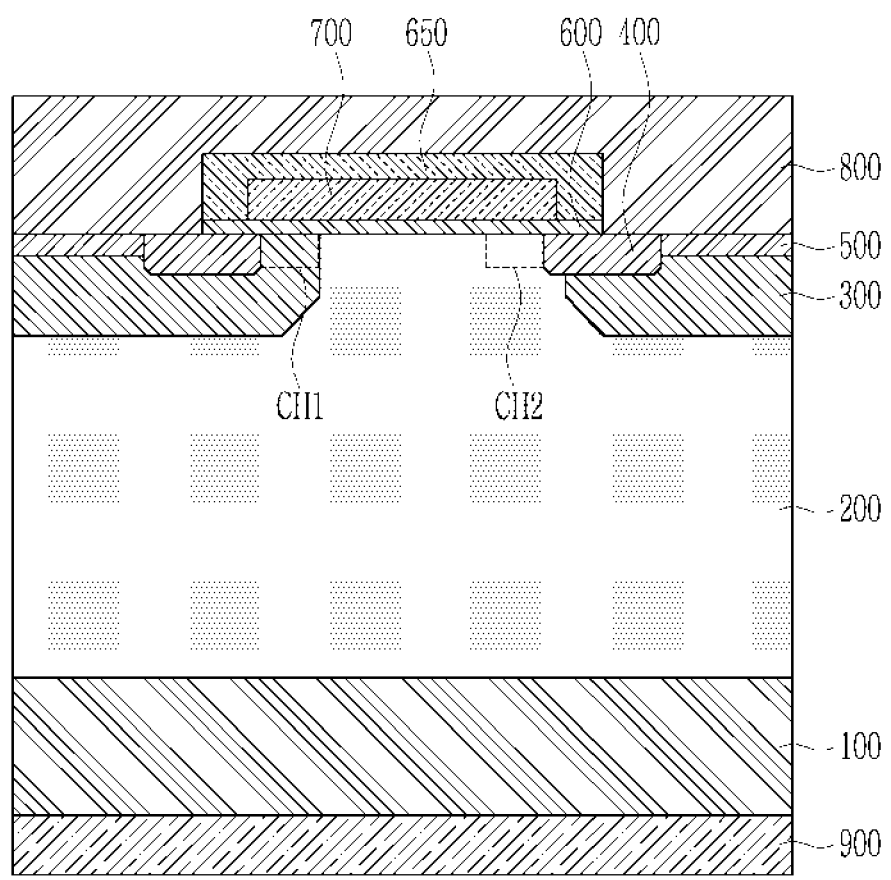
FIG. 2 is a view schematically showing an example of a cross-sectional taken along a line II-II of FIG. 1.
Figure 3:
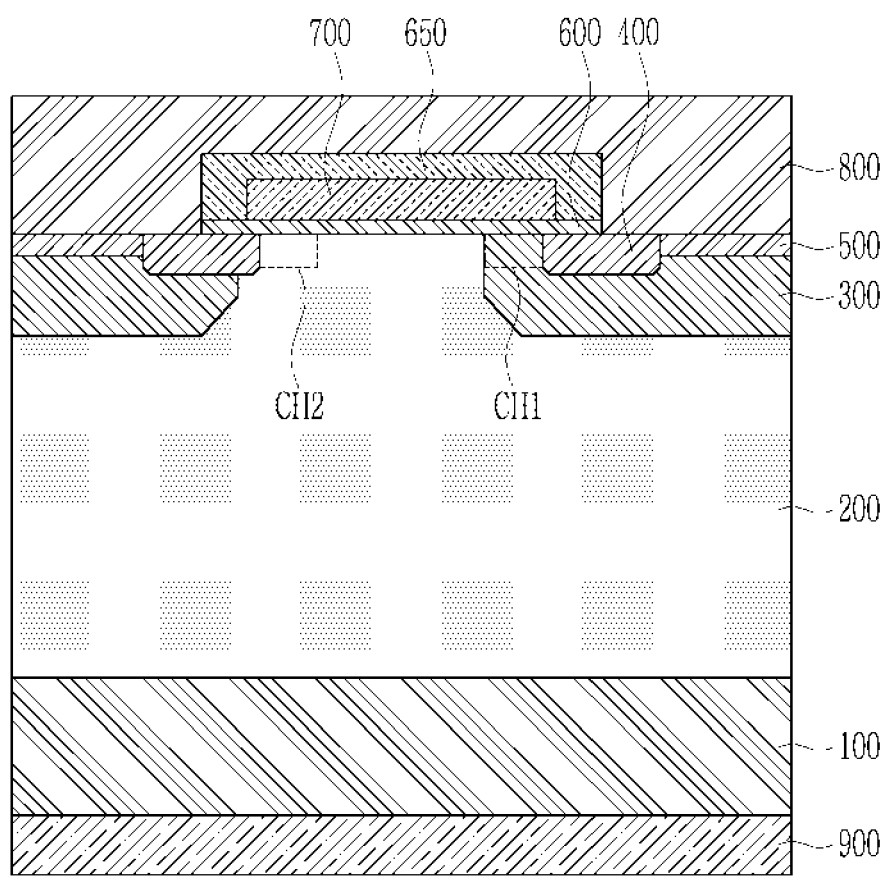
FIG. 3 is a view schematically showing an example of a cross-sectional taken along a line III-III of FIG. 1.

FIG. 1 is a view schematically showing an example of a layout of a semiconductor device in some forms of the present disclosure. FIG. 2 is a view schematically showing an example of a cross-sectional taken along a line II-II of FIG. 1. FIG. 3 is a view schematically showing an example of a cross-sectional taken along a line III-III of FIG. 1.

Referring to FIG. 1 to FIG. 3, the semiconductor device in some forms of the present disclosure includes a substrate 100, an n– type layer 200, a p type region 300, an n+ type region 400, a p+ type region 500, a gate insulating layer 600, an insulating layer 650, a gate electrode 700, a source electrode 800, and a drain electrode 900.

FIG. 1 is the view schematically showing one example of the layout of the semiconductor device in which the insulating layer 650, the gate electrode 700, and the source electrode 800 are omitted.

First, a detail stacked structure of the semiconductor device in some forms of the present disclosure will be described.

The substrate 100 may be a n+ type silicon carbide substrate.

The n– type layer 200 is disposed on a first surface of the substrate 100. The p type region 300, the n+ type region 400, and the p+ type region 500 are disposed at an upper part in the n– type layer 200. The n+ type region 400 and the p+ type region 500 are disposed at the upper part in the p type region 300. The n+ type region 400 and the p+ type region 500 are disposed adjacent to each other and in contact with each other.

The n-type layer 200 may be formed on the first surface of the substrate 100 by an epitaxial growth. The p type region 300 may be formed by injecting a p type ion such as boron (B), aluminum (Al), gallium (Ga), and indium (In) on the upper surface of the n– type layer 200. The n+ type region 400 may be formed by injecting a n type ion such as nitrogen (N), phosphorus (P), arsenic (As), and antimony (Sb) on the upper surface of the p type region 300. The p+ type region 500 may be formed by injecting the p type ion such as boron (B), aluminum (Al), gallium (Ga), and indium (In) on the upper surface of the p type region 300. An ion doping concentration of the p+ type region 500 is higher than the ion doping concentration of the p type region 300.

The gate insulating layer 600 is disposed on the n– type layer 200, the p type region 300, and the n+ type region 400, and the gate electrode 700 is disposed on the gate insulating layer 600. The insulating layer 650 is disposed on the gate electrode 700 and the gate insulating layer 600. The insulating layer 650 covers a side surface of the gate electrode 700.

The gate insulating layer 600 and the insulating layer 650 may include silicon oxide ($SiO_2$), and the gate electrode 700 may include a poly-crystalline silicone or a metal.

The source electrode 800 is disposed on the p+ type region 500, the n+ type region 400, and the insulating layer 650 and the drain electrode 900 is disposed at the second surface of the substrate 100. The source electrode 800 is in contact with the n+ type region 400 and the p+ type region 500. Here, the second surface of the substrate 100 indicates a surface opposite to the first surface of the substrate 100. The source electrode 800 and the drain electrode 900 may include an ohmic metal.

Next, the layout of the semiconductor device in some forms of the present disclosure will be described.

The n+ type region 400 is respectively disposed at a left side and a right side of the n– type layer 200 in a plan view, and the p+ type region 500 is disposed at the outer surface of the n+ type region 400. The n+ type region 400 and the p+ type region 500 have a striped pattern shape in a plan view.

The p type region 300 is disposed at the inner surface of the n+ type region 400 in a plan view and is separated along a length direction of the n+ type region 400 in a plan view by a predetermined interval. That is, the n– type layer 200 is disposed between the p type region 300 along the length direction of the n+ type region 400 in a plan view.

Here, the inner surface of the n+ type region 400 in a plan view is the side surface of the side where the n+ type region 400 is in contact with the n– type layer 200 in a plan view, and the outer surface of the n+ type region 400 in a plan view is the surface opposite to the inner surface of the n+ type region 400 in a plan view.

The gate insulating layer 600 is disposed on the n– type layer 200, the p type region 300, and the n+ type region 400 (referring to FIG. 2 and FIG. 3). The p type region 300 is disposed in a zigzag shape based on a center line of the gate insulating layer 600 in a plan view.

A channel CH of the semiconductor device is formed in the p type region 300 and the n– type layer 200 that overlap the gate insulating layer 600 and are disposed at the outer surface of the n+ type region 400 in a plan view. The channel CH of the semiconductor device includes a first channel CH1 and a second channel CH2. The first channel CH1 is formed in the p type region 300 overlapping the gate insulating layer 600 and disposed at the inner surface of the n+ type region 400 in a plan view. This first channel CH1 is an inversion layer channel. The second channel CH2 is formed in the n– type layer 200 overlapping the gate insulating layer 600 and disposed at the inner surface of the n+ type region 400 in a plan view. This second channel CH2 is an accumulation layer channel.

That is, the semiconductor device in some forms of the present disclosure is a planar gate MOSFET element including the inversion layer channel and the accumulation layer channel.

If the voltage is applied to the gate electrode 700, the electron and the current flow through the channel from the source electrode 800 to the drain electrode 900. In the semiconductor device in some forms of the present disclosure, as the channel CH includes the second channel CH2 of the accumulation layer channel as well as the first channel CH1 of the inversion layer channel, the electron and the current are dispersed compared with the general planar gate MOSFET element including only the inversion layer channel, thereby improving the mobility of the electron and the current. Accordingly, the semiconductor device in some forms of the present disclosure may decrease the on resistance compared with the planar gate MOSFET element including only the inversion layer channel.

Also, in the semiconductor device in some forms of the present disclosure, a characteristic of the on state and the off state may be controlled by a width of the second channel CH2. The width of the second channel CH2 is the interval between the p type region 300 separated along the length direction of the n+ type region 400 in a plan view. In the off state of the semiconductor device, a current path is not formed between the p type region 300 separated along the length direction of the n+ type region 400 in a plan view by a depletion layer formed from the p type region 300.

Also, in the semiconductor device in some forms of the present disclosure, because the width of the second channel CH2 may be controlled by the p type region 300 formed by the p type ion injection, the process difficulty may be reduced compared to the general planar gate MOSFET element including only the accumulation layer channel.

On the other hand, in the case of the semiconductor device in some forms of the present disclosure, the p type region 300 is disposed in the zigzag shape based on the center line of the gate insulating layer 600 in a plan view, however it is not limited thereto and it may be disposed in various shapes. This will be described with reference to FIG. 4.

Figure 4:
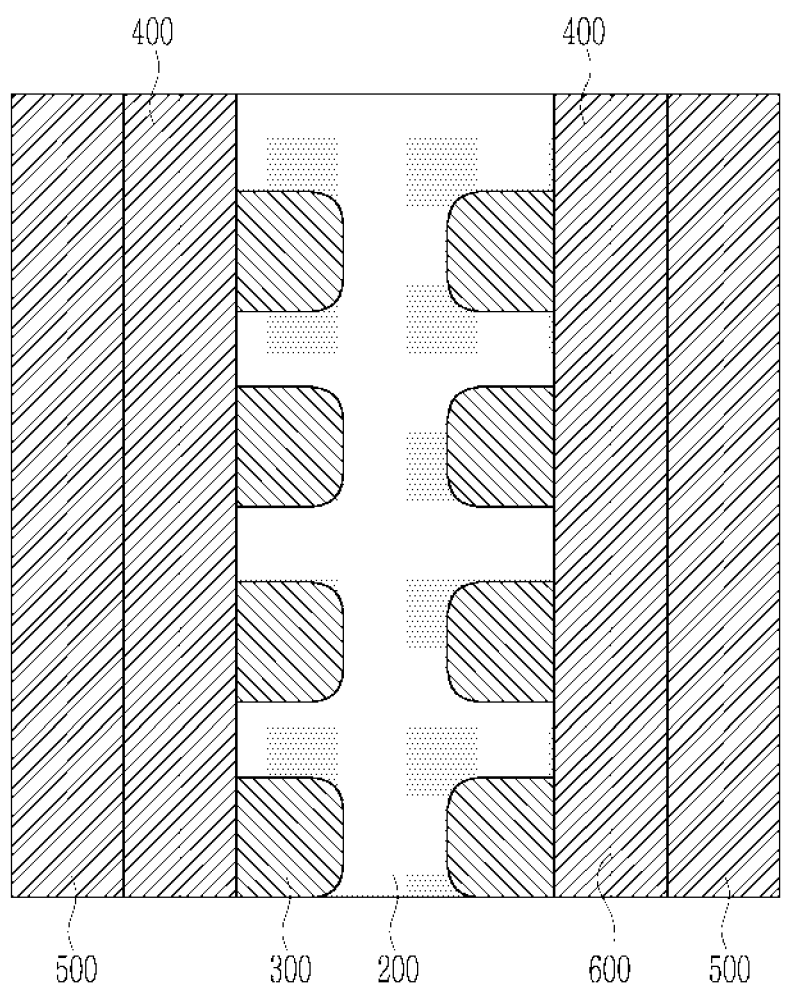
FIG. 4 is a view schematically showing an example of a layout of a semiconductor device.

FIG. 4 is a view schematically showing an example of a layout of a semiconductor device in some forms of the present disclosure.

Like FIG. 1, FIG. 4 is the view schematically showing one example of the layout of the semiconductor device in which the insulating layer 650, the gate electrode 700, and the source electrode 800 are omitted.

Referring to FIG. 4, the arrangement shape of the p type region 300 in a plan view is only different compared to the semiconductor device of FIG. 1 to FIG. 3, the rest structure is the same. Accordingly, the description for the same structure is omitted.

The p type region 300 is disposed at the inner surface of the n+ type region 400 in a plan view and is separated by the predetermined interval along the length direction of the n+ type region 400 in a plan view. That is, the n− type layer 200 is disposed between the p type region 300 along the length direction of the n+ type region 400 in a plan view.

The p type region 300 is disposed in a symmetric shape based on the center line of the gate insulating layer 600 in a plan view.

The description of the disclosure is merely exemplary in nature and, thus, variations that do not depart from the substance of the disclosure are intended to be within the scope of the disclosure. Such variations are not to be regarded as a departure from the spirit and scope of the disclosure.

DESCRIPTION OF SYMBOLS

100: substrate
200: n− type layer
300: p type region
400: n+ type region
500: p+ type region
600: gate insulating layer
650: insulating layer
700: gate electrode
800: source electrode
900: drain electrode

What is claimed is:

1. A semiconductor device comprising:
a substrate;
an n− type layer disposed at a first surface of the substrate;
an n+ type region, a p type region, and a p+ type region disposed at an upper part of the n− type layer;
a gate insulating layer disposed on the n− type layer, the p type region, and the n+ type region;
a gate electrode disposed on the gate insulating layer;
a source electrode insulated from the gate electrode and disposed on the p+ type region and the n+ type region; and
a drain electrode disposed at a second surface of the substrate,
wherein the n+ type region is disposed at a left side of the n− type layer and at a right side of the n− type layer in a plan view,
wherein the p+ type region is disposed at an outer surface of the n+ type region in a plan view,
wherein the n+ type region and the p+ type region are configured to form in a striped pattern in a plan view, and
wherein the p type region is disposed at an inner surface of the n+ type region in a plan view and is separated by a predetermined interval along a longitudinal direction of the n+ type region in a plan view.

2. The semiconductor device of claim 1, wherein:
the n− type layer is disposed between the p type regions.

3. The semiconductor device of claim 2, wherein:
a channel is formed in the p type region and the n− type layer, wherein the p type region and the n− type layer overlap the gate insulating layer and are disposed at the outer surface of the n+ type region in a plan view.

4. The semiconductor device of claim 3, wherein:
the channel comprises a first channel and a second channel.

5. The semiconductor device of claim 4, wherein:
the first channel is formed at the p type region that overlaps the gate insulating layer and that is disposed at the inner surface of the n+ type region in a plan view.

6. The semiconductor device of claim 5, wherein:
the second channel is formed at the n− type layer that overlaps the gate insulating layer and that is disposed at the inner surface of the n+ type region in a plan view.

7. The semiconductor device of claim 6, wherein:
the p type region is disposed in a zigzag shape from a center line of the gate insulating layer in a plan view.

8. The semiconductor device of claim 6, wherein:
the p type region is disposed in a symmetric shape from the center line of the gate insulating layer in a plan view.

9. The semiconductor device of claim 2, wherein:
the n+ type region and the p+ type region are disposed at the upper part of the p type region.

10. The semiconductor device of claim 9, wherein:
the n+ type region and the p+ type region are disposed adjacent to each other and are in contact with each other.

* * * * *